United States Patent
Pasotti et al.

(10) Patent No.: US 10,049,736 B2
(45) Date of Patent: Aug. 14, 2018

(54) MEMORY DEVICE INCLUDING DECODER FOR A PROGRAM PULSE AND RELATED METHODS

(71) Applicants: STMicroelectronics S.r.l., Agrate Brianza (MB) (IT); STMicroelectronics International N.V., Amsterdam (NL)

(72) Inventors: Marco Pasotti, Travaco' Siccomario (IT); Marcella Carissimi, Treviolo (IT); Vikas Rana, Noida (IN)

(73) Assignees: STMicroelectronics International N.V., Amsterdam (NL); STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/433,795

(22) Filed: Feb. 15, 2017

(65) Prior Publication Data

US 2017/0178727 A1    Jun. 22, 2017

Related U.S. Application Data

(62) Division of application No. 14/971,345, filed on Dec. 16, 2015, now Pat. No. 9,613,696.

(51) Int. Cl.
*G11C 11/00* (2006.01)
*G11C 13/00* (2006.01)

(52) U.S. Cl.
CPC ...... *G11C 13/0069* (2013.01); *G11C 13/0004* (2013.01); *G11C 13/0026* (2013.01); *G11C 2013/0078* (2013.01)

(58) Field of Classification Search
CPC . G11C 11/00; G11C 13/0069; G11C 13/0004; G11C 2013/0078

USPC .......... 365/46, 94, 100, 113, 129, 148, 163
See application file for complete search history.

(56) References Cited

U.S. PATENT DOCUMENTS

| | | | | |
|---|---|---|---|---|
| 2006/0097240 A1* | 5/2006 | Lowrey | ............. | G11C 13/0004 257/5 |
| 2006/0097342 A1* | 5/2006 | Parkinson | .......... | G11C 13/0004 257/528 |
| 2008/0137402 A1* | 6/2008 | Cho | ................... | G11C 13/0004 365/163 |
| 2008/0232158 A1* | 9/2008 | Lamorey | ........... | G11C 13/0004 365/163 |

(Continued)

OTHER PUBLICATIONS

Villa et al., A 45 nm 1Gb 1.8V Phase-Change Memory, 2010 IEEE International Solid-State Circuits Conference, Digest of Tchnical Papers, ISSCC 2010/Session 14/Non-Volatile Memory/14.8, pp. 270-271.

*Primary Examiner* — Harry W Byrne
(74) *Attorney, Agent, or Firm* — Slater Matsil, LLP

(57) ABSTRACT

An integrated circuit includes an array of phase-change memory (PCM) cells, and bitlines coupled to the array of PCM cells. The integrated circuit also includes a first decoder circuit having a respective plurality of transistors having a first conductivity type being coupled together and to a given bitline from among the plurality thereof and configured to inject a program current pulse into a selected PCM cell. In addition, the integrated circuit includes a second decoder circuit having a plurality of transistors having a second conductivity type being coupled together and to the given bitline and configured to discharge the given bitline at an end of the program current pulse.

21 Claims, 2 Drawing Sheets

(56) References Cited

U.S. PATENT DOCUMENTS

| | | | |
|---|---|---|---|
| 2009/0213644 A1* | 8/2009 | Parkinson | G11C 11/56 365/163 |
| 2009/0303781 A1* | 12/2009 | Lowrey | G11C 5/02 365/163 |
| 2010/0002498 A1* | 1/2010 | Philipp | G11C 11/56 365/163 |
| 2011/0063902 A1* | 3/2011 | Lung | G11C 7/067 365/163 |
| 2014/0198553 A1* | 7/2014 | Lung | G11C 13/0004 365/63 |

* cited by examiner

MEMORY DEVICE INCLUDING DECODER FOR A PROGRAM PULSE AND RELATED METHODS

CROSS-REFERENCE TO RELATED APPLICATIONS

This application is a divisional of U.S. patent application Ser. No. 14/971,345, filed on Dec. 16, 2015, and entitled "Memory Device Including Decoder for a Program Pulse and Related Methods," which application is hereby incorporated herein by reference.

TECHNICAL FIELD

The present invention relates to the field of memories, and, more particularly, to a decoder for a program pulse for non-volatile memory devices and related methods.

BACKGROUND

Non-volatile phase-change memories (PCMs) incorporate materials that have the ability to switch between phases having different electrical characteristics. For example, these materials can switch between a disorderly amorphous phase and an orderly crystalline or polycrystalline phase, and the two phases are associated with resistivities of considerably different values, and consequently with a different value of a stored data. For example, the elements of Group VI of the periodic table, such as tellurium (Te), selenium (Se), or antimonium (Sb), referred to as chalcogenides or chalcogenic materials, can be advantageously used for manufacturing phase-change memory cells. The phase changes are obtained by increasing locally the temperature of the cells of chalcogenic material, through resistive electrodes (generally known as heaters) set in contact with respective regions of chalcogenic material. Selection devices (for example, MOSFETs), are connected to the heaters, and enable passage of a programming electrical current through a respective heater. The electrical current, by the Joule effect, generates the temperatures necessary for the phase change. During reading, the state of the chalcogenic material is detected by applying a voltage that is sufficiently low as not to cause a marked heating, and then by reading the value of the current that flows in the cell. Since the current is proportional to the conductivity of the chalcogenic material, it is possible to determine in which state the material is, and hence determine the data stored in the memory cells.

Non-volatile memories include an array of memory cells organized in rows (wordlines) and columns (bitlines). Each memory cell is formed, in the case of PCMs, by a phase-change memory element and by a selector transistor, connected in series. A column decoder and a row decoder, on the basis of logic address signals received at the input and more decoding schemes, enable selection of the memory cells, and in particular of the corresponding wordlines and bitlines.

The column decoder may include analog selection switches, which receive on their respective control terminals the address signals. The selection switches may be organized according to a tree structure in hierarchical levels, and their number in each hierarchical level is linked to the organization and to the size of the memory array. The selection switches, when enabled, allow the selected bitline to be brought to a definite value of voltage and/or current, according to the operations that it is desired to implement. In particular, a current path is created between a programming stage or a reading stage and the bitline selected. The current path is defined by the series of a certain number of selection switches, and is the same (within the memory array) both for the programming stage and for the reading stage. In particular, upstream of the current path, a selector is generally provided for associating the path alternatively with the programming stage or with the reading stage. Generally, the bitline-biasing voltages for reading operations are generated inside sense amplifiers used for reading the data in the reading stage, and the bitline-biasing voltages for writing operations are generated inside purposely provided programming drivers in the programming stage. The sense amplifiers carry out reading of the data stored in the memory cells by comparing the current that flows in the memory cell selected with a reference current that flows in a reference cell.

In the specific case of PCMs, in order to carry out a writing operation, a high current program pulse is applied through a selected memory cell. As high current is being applied to the memory cell, closure of the program current pulse may be critical. In addition, the bitlines of non-selected memory cells are floating and discharged though the memory cell itself. Reliability is a prime concern for PCM cells for retention of correct data for a specified endurance cycle. The discharge path of a bitline through the PCM cells may generate a weak set condition due to the high capacitance of the bitline that is at high voltage as well.

SUMMARY

An integrated circuit includes an array of phase-change memory (PCM) cells, a plurality of bitlines coupled to the array of PCM cells, and a first decoder circuit including a respective plurality of transistors having a first conductivity type being coupled together and to a given bitline from among the plurality thereof. The first decoder circuit is configured to inject a program current pulse into a selected PCM cell from among the array thereof. In addition, the integrated circuit includes a second decoder circuit having a plurality of transistors of a second conductivity type being coupled together and to the given bitline and is configured to discharge the given bitline at an end of the program current pulse.

Another aspect is directed to a method of using a decoder circuit coupled to an array of phase-change memory (PCM) cells. The decoder circuit includes a first plurality of transistors having a first conductivity type coupled together and to a given bitline from among the plurality thereof and configured to inject a program current pulse into a selected PCM cell from among the plurality thereof, and a second plurality of transistors having a second conductivity type coupled together and to the given bitline and configured to discharge the given bitline at an end of the program current pulse. The method includes injecting the program current pulse into the selected PCM cell during a program operation, and discharging the given bitline by the second plurality of transistors at the end of the program current pulse.

DETAILED DESCRIPTION OF ILLUSTRATIVE EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
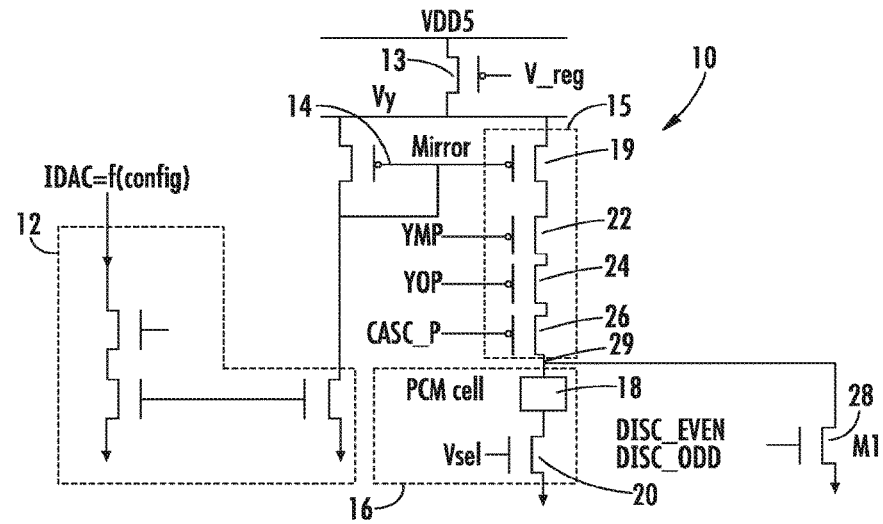
FIG. 1 is a schematic circuit diagram of a portion of a non-volatile memory device, in particular of a PCM type, and a column decoder as in the prior art.

Referring initially to FIG. 1, a portion of a prior art non-volatile memory device, in particular of a PCM type, designated as a whole by the reference number 10, is described. In particular, the prior art non-volatile memory device 10 comprises a plurality of memory cells 16, arranged according to array wordlines WL and array bitlines BL, as is known by those skilled in the art. Each memory cell 16 is identical to one another and comprises a phase-change element 18 and a selector element 20, operatively coupled thereto.

The phase-change element 18 includes a phase-change material (for example, a chalcogenide), and is able to store data in the form of resistance levels associated to the various phases assumed by the phase-change material.

The selector element 20 is an NMOS transistor having its gate terminal connected to the array wordline WL, its drain terminal connected to the phase-change element 18, and its source terminal connected to a reference potential (in particular ground, GND). The selector element 20 is controlled so as to enable, when selected, passage of a programming current pulse through the phase-change element 18 during a programming operation.

The memory device 143 further comprises a first decoder circuit 15 to select the bitline BL corresponding to the memory cell 16 to be addressed, and a row decoder (not shown) to select the array wordline WL corresponding to the memory cell to be addressed. The first decoder circuit 15 is defined by a series of transistors 19, 22, 24, and 26 transistors of a first conductivity type connected between a voltage reference VDD and the memory cell 16 to be programmed. The transistors of the first conductivity type comprise P-type (PMOS) transistors in the illustrated embodiment.

The first decoder circuit 15 receives decoded address signals, generated in a known way that is not illustrated in detail, and biasing signals. The first decoder circuit 15 is configured so as to address a given bitline BL 29, i.e., so as to select, on the basis of the decoded address signals, the given bitline 29, and so as to enable biasing thereof at a given electrical level.

In particular, a selector transistor 13 may be a P-type MOS (PMOS) transistor having its source terminal connected to the voltage reference VDD and its gate terminal connected to an output of a switch that is fed by a regulated voltage reference V reg. The transistor 19 has its gate terminal connected to the gate of transistor 17 of current mirror circuit 14. The transistors 22 and 24 are hierarchic decoder transistors, and have their gate terminals connected to corresponding switches (not shown). A third transistor 26 has its source terminal coupled to the drain terminal of transistor 24 and its drain terminal coupled to the bitline BL 29 and the phase-change element 18 of the memory cell 16, and its gate terminal coupled to a cascode (CASC) voltage.

A low voltage program current pulse from a current D/A converter (IDAC) 12, is mirrored to the memory cell 16 in a high voltage state. The configurable IDAC 12 is used to shape the program current profile to the memory cell 16. The program current pulse is injected to the storage element 18 of the memory cell 16, through the first decoder circuit 15. Non-selected memory cells of adjacent wordlines WL are at ground through a first NMOS transistor 28. Bitlines BL of selected wordlines WL are not forced to ground at the end of the program current pulse, but instead the discharge of the respective bitline 29 is through the memory cell 16 itself. Accordingly, non-selected memory cells of the selected wordline WL are floating.

Figure 2:
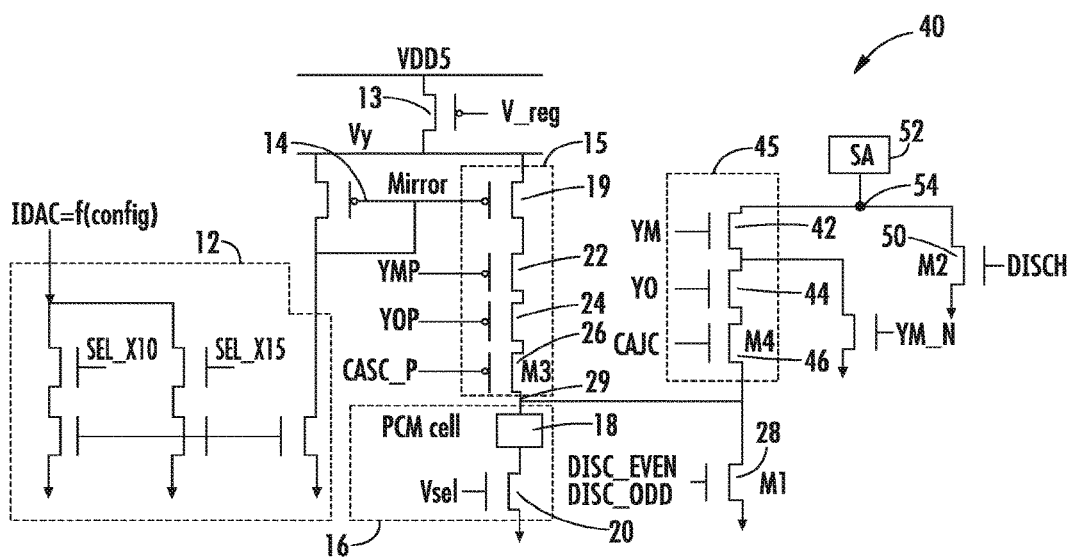
FIG. 2 is a schematic circuit diagram of a portion of a non-volatile memory device, in particular of a PCM type, in accordance with the invention.

A memory device 40 of an embodiment of the invention is now described with reference to FIG. 2. The memory device 40 includes a second decoder circuit 45 defined by a series of transistors 42, 44, and 46 of a second conductivity type coupled between the bitline 29 and a drain terminal of a second transistor 50 that has its source terminal coupled to ground. The transistors of the second conductivity type may comprise N-type (NMOS) transistors and be low voltage.

The decoded address signals for the selected memory cell 16 of the selected wordline WL are configured to activate the first decoder circuit 15 and the second decoder circuit 45 at substantially the same time during the program current pulse. The CASC voltage is coupled to the gate of a third transistor 26 and a fourth transistor 46 and used to minimize the stress condition on those transistors. In the programming operation, the sense amplifier (SA) 52 is not activated and the SA node 54 is floating.

Figure 3:
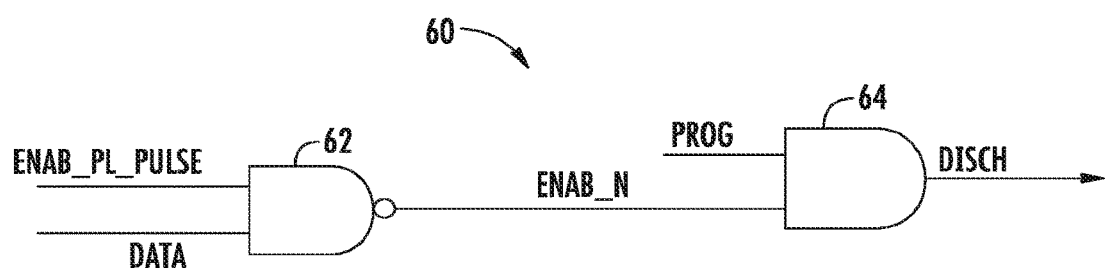
FIG. 3 is a schematic circuit diagram of a circuit to generate a discharge signal for the device of FIG. 2.

Referring now to FIG. 3, a discharge circuit 60 is configured to generate a DISCH signal to activate the second transistor 50. The discharge circuit 60 may include a first logic gate, for instance a NAND gate 62, having a first input terminal for receiving as input an enable signal ENABLE_PL_PULSE, and a second input terminal for receiving as input a DATA signal, and an output terminal to generate an ENAB_N signal. The discharge circuit 60 may include a second logic gate, for instance an AND gate 64, having a first input terminal for receiving as input a PROG signal, and a second input for receiving as input the ENAB_N signal from the output of the NAND gate 62. The AND gate 64 may also include an output terminal and be configured to generate the DISCH signal and be coupled to the gate terminal of the second transistor 50. It is understood that the discharge circuit 60 may be obtained using a different or more complicated combination of logic elements.

In operation, the DISCH signal depends on the data content. For example, if DATA is o for that memory cell, which means no program current pulse, then DISCH is active on that memory cell. The DISCH signal is also driven to a high condition when the program current pulse is ended with the signal ENAB_PL_PULSE.

The bitline conditions include that the adjacent memory cells of the selected wordlines WLs are clamped to the reference voltage (e.g., ground) through the first transistor 28, non-selected memory cells of a selected wordline WL are also clamped to ground through the second transistor 50 driven by the DISCH signal during the program current pulse, and a selected memory cell at the end of the program pulse is clamped to ground by the second transistor 50 that is used to discharge the bitline 29 in response to the DISCH signal that is active at the end of the signal ENAB_PL_PULSE. Accordingly, the selected memory cell 16 is isolated from the discharge of the given bitline at the end of the program current pulse by the second decoder circuit 45 and activation of the second transistor 50.

Another aspect of the invention is directed to a method of using a decoder coupled to an array of phase-change memory (PCM) cells. The decoder includes a first plurality of transistors having a first conductivity type coupled together and to a given bitline and configured to inject a program current pulse into a selected PCM cell from among the array thereof, and a second plurality of transistors having a second conductivity type coupled together and to the given bitline and configured to discharge the given bitline at an end of the program current pulse.

The method includes injecting the program current pulse into the selected PCM cell during a program operation, and discharging the given bitline by the second plurality of transistors at the end of the program current pulse.

From what has been described and illustrated previously, the advantages of the decoder circuit according to the present disclosure are evident. In particular, the approaches described herein enable the use of the peculiarities of PCM cells. For example, by defining the bitline voltages at ground, a more accurate shape for a reset pulse is achieved on the PCM cells because the PCM cells are not floating at high voltages. The reliability of the reset condition is also increased since the PCM cells are discharged to ground, and a time to discharge the capacitance of the bitlines is decreased.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A decoder circuit for a non-volatile memory device comprising a plurality of memory cells and a plurality of bitlines coupled to the plurality of memory cells, the decoder circuit comprising:
    a first plurality of transistors having a first conductivity type being coupled together and to a given bitline from among the plurality of bitlines, the first plurality of transistors being configured to inject a program current pulse into a selected memory cell from among the plurality of memory cells; and
    a second plurality of transistors having a second conductivity type being coupled together and to the given bitline, the second plurality of transistors being configured to discharge the given bitline at an end of the program current pulse.

2. The decoder circuit of claim 1, wherein the first plurality of transistors comprises P-type (PMOS) transistors and the second plurality of transistors comprises N-type (NMOS) transistors.

3. The decoder circuit of claim 1, further comprising a first transistor coupled to the second plurality of transistors and configured to enable the second plurality of transistors to discharge the given bitline to a reference voltage at the end of the program current pulse.

4. The decoder circuit of claim 3, wherein the first transistor comprises an N-type (NMOS) transistor.

5. The decoder circuit of claim 3, further comprising a discharge circuit having an output coupled to a gate terminal of the first transistor and configured to provide a discharge signal to activate the first transistor at the end of the program current pulse.

6. The decoder circuit of claim 5, wherein the discharge circuit is enabled at the end of the program current pulse by an enable signal.

7. The decoder circuit of claim 1, wherein the selected memory cell is isolated from a discharge of the given bitline at the end of the program current pulse by the second plurality of transistors.

8. The decoder circuit of claim 1, wherein the second plurality of transistors comprises low voltage transistors.

9. The decoder circuit of claim 1, wherein the memory cells comprise phase-change memory cells.

10. A method of operating a decoder circuit for a phase-change non-volatile memory device that comprises a plurality of memory cells and a plurality of bitlines coupled to the plurality of memory cells, the decoder circuit comprising a first plurality of transistors having a first conductivity type being coupled together and to a given bitline from among the plurality of bitlines, the first plurality of transistors being configured to inject a program current pulse into a selected memory cell from among the plurality of memory cells, the decoder circuit further comprising a second plurality of transistors having a second conductivity type being coupled together and to the given bitline, the second plurality of transistors being configured to discharge the given bitline at an end of the program current pulse, wherein the method comprises:
    selecting a memory cell from among the array of memory cells;
    injecting, by the first plurality of transistors, a program current pulse into the selected memory cell during a program operation; and
    discharging, by the second plurality of transistors, the given bitline at an end of the program current pulse.

11. The method of claim 10, wherein the memory cells comprise phase-change memory cells.

12. The method of claim 10, wherein the decoder further comprises a first transistor coupled to the second plurality of transistors and configured to enable the second plurality of transistors to discharge the given bitline to a reference voltage at the end of the program current pulse.

13. The method of claim 10, wherein the selected memory cell is isolated from the discharge of the given bitline at the end of the program current pulse by the second plurality of transistors.

14. A decoder circuit for a phase-change non-volatile memory device comprising a plurality of phase-change memory (PCM) cells and a plurality of bitlines coupled to the plurality of PCM cells, the decoder circuit comprising:
    a first plurality of transistors having a first conductivity type being coupled together and to a given bitline from among the plurality of bitlines;
    a first terminal controllably coupled to a first voltage reference;
    a second terminal coupled to a given bitline of the plurality of bitlines, wherein a selected PCM cell is also coupled to the given bitline;
    a third terminal configured to receive a program current pulse, the first plurality of transistors being configured to inject a program current pulse into the selected PCM;
    a second plurality of transistors having a second conductivity type being coupled together and to the given bitline;
    a fourth terminal coupled to the selected bitline;

a fifth terminal controllably coupled to a second voltage reference, the second plurality of transistors being configured to discharge the given bitline at an end of the program current pulse.

15. The circuit of claim 14, further comprising a first switch coupled between the second terminal and the second voltage reference, the first switch being controllable to couple the second terminal to the second voltage reference at the end of the program current pulse.

16. The circuit of claim 14, wherein the bitline is configured to discharge in response to a transistor of the second plurality of transistors coupling the bitline to the second voltage reference.

17. The circuit of claim 14, wherein the first plurality of transistors comprises P-type (PMOS) transistors and the second plurality of transistors comprises N-type (NMOS) transistors.

18. The circuit of claim 14, further comprising a control circuit configured to generate a control signal for coupling the second terminal of the second decoder circuit to the second voltage reference at the end of the program current pulse.

19. The circuit of claim 14, wherein decoded address signals for the selected memory cell are configured to activate a transistor of the first plurality of transistors and a transistor of the second plurality of transistors concurrently during the program current pulse.

20. The circuit of claim 14, wherein decoded address signals for the selected memory cell are configured to activate transistors of the first plurality of transistors and transistors of the second plurality of transistors concurrently during the program current pulse.

21. The circuit of claim 14, wherein decoded address signals for the selected memory cell are configured to activate all transistors of the first plurality of transistors and all transistors of the second plurality of transistors concurrently during the program current pulse.

* * * * *